(12) United States Patent
Chang et al.

(10) Patent No.: US 10,157,783 B2
(45) Date of Patent: Dec. 18, 2018

(54) SEMICONDUCTOR DEVICES, FINFET DEVICES AND METHODS OF FORMING THE SAME

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 2 days.

(21) Appl. No.: 15/701,416

(22) Filed: Sep. 11, 2017

(65) Prior Publication Data
US 2018/0005877 A1  Jan. 4, 2018

Related U.S. Application Data

(63) Continuation of application No. 15/062,226, filed on Mar. 7, 2016, now Pat. No. 9,761,483.

(51) Int. Cl.
| | |
|---|---|
| *H01L 29/43* | (2006.01) |
| *H01L 21/768* | (2006.01) |
| *H01L 21/02* | (2006.01) |
| *H01L 29/423* | (2006.01) |
| *H01L 29/78* | (2006.01) |
| *H01L 29/66* | (2006.01) |

(52) U.S. Cl.
CPC .. *H01L 21/76834* (2013.01); *H01L 21/02123* (2013.01); *H01L 21/76802* (2013.01); *H01L 29/42372* (2013.01); *H01L 29/66545* (2013.01); *H01L 29/66795* (2013.01); *H01L 29/785* (2013.01); *H01L 29/7848* (2013.01)

(58) Field of Classification Search
CPC ......... H01L 21/76834; H01L 21/02123; H01L 21/76802; H01L 29/42372; H01L 29/785; H01L 23/5329; H01L 23/528; H01L 29/78; H01L 21/76877; H01L 21/283
USPC ......... 257/288, 368, 369; 438/151, 197, 199
See application file for complete search history.

(56) References Cited

U.S. PATENT DOCUMENTS

| | | | |
|---|---|---|---|
| 2015/0021672 A1* | 1/2015 | Chuang | H01L 21/28088 257/288 |
| 2015/0243751 A1* | 8/2015 | Liu | H01L 21/76834 257/288 |
| 2016/0064511 A1* | 3/2016 | Cheng | H01L 29/6681 438/283 |

* cited by examiner

*Primary Examiner* — Shahed Ahmed
(74) *Attorney, Agent, or Firm* — JCIPRNET

(57) ABSTRACT

Semiconductor devices, FinFET devices and methods of forming the same are provided. In accordance with some embodiments, a semiconductor device includes a substrate, a first gate stack, a spacer, a first dielectric layer, a shielding layer and a connector. The first gate stack is over the substrate. The spacer is disposed on and contacted to at least one sidewall of the first gate stack. The first dielectric layer is aside the spacer. The shielding layer covers a top surface of the spacer and a top surface of the first dielectric layer. The connector contacts a portion of a top surface of the first gate stack.

16 Claims, 10 Drawing Sheets

SEMICONDUCTOR DEVICES, FINFET DEVICES AND METHODS OF FORMING THE SAME

CROSS-REFERENCE TO RELATED APPLICATION

This application is a continuation application of and claims the priority benefit of a prior application Ser. No. 15/062,226, filed on Mar. 7, 2016, now allowed. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
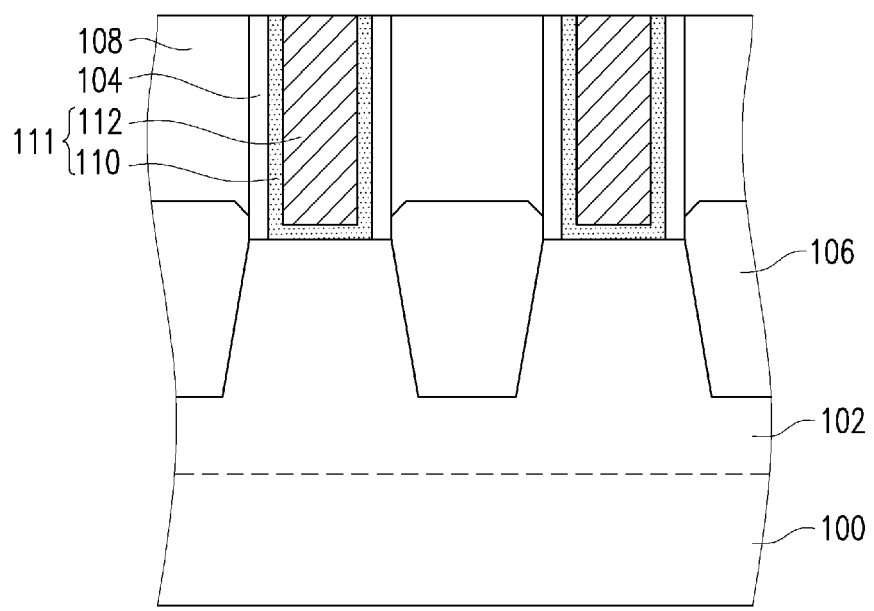
FIG. 1A to FIG. 1F are schematic cross-sectional views of a method of forming a FinFET device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1F are schematic cross-sectional views of a method of forming a FinFET device in accordance with some embodiments.

Referring to FIG. 1A, a substrate 100 with one or more fins 102 is provided. In some embodiments, the substrate 100 includes a silicon-containing substrate, a silicon-on-insulator (SOI) substrate, or a substrate formed of other suitable semiconductor materials. Depending on the requirements of design, the substrate 100 may be a P-type substrate or an N-type substrate and may have doped regions therein. The doped regions may be configured for an N-type FinFET device or a P-type FinFET device. In some embodiments, the substrate 100 has an isolation layer formed thereon. Specifically, the isolation layer covers lower portions of the fins 102 and exposes upper portions of the fins 102. In some embodiments, the isolation layer is a shallow trench isolation (STI) structure.

In some embodiments, the substrate 100 has at least two gate stacks 111 formed thereon, spacers 104 formed on the sidewalls of the gate stacks 111, strained layers 106 formed therein, and a first dielectric layer 108 formed aside the gate stacks 111 and over the strained layers 106.

In some embodiments, the method of forming the intermediate structure of FIG. 1A includes forming two dummy gate stacks across the fins 102, forming spacers 104 on the sidewalls of the dummy gate stacks, forming strained layers 106 at two sides of each fin 102, forming a first dielectric layer 108 aside the dummy gate stacks and over the strained layers 106, and replacing the dummy gate stacks with gate stacks 111.

In some embodiments, the dummy gate stacks include a silicon-containing material, such as polysilicon, amorphous silicon or a combination thereof. In some embodiments, the dummy gate stacks extend in a direction different from (e.g., perpendicular to) the extending direction of the fins 102. In some embodiments, the method of forming the dummy gate stacks includes forming a stacked layer on the substrate 100 and patterning the stacked layer with photolithography and etching processes.

In some embodiments, the spacers 104 include a nitrogen-containing dielectric material, a carbon-containing dielectric material or both, and the spacers 104 have a dielectric constant less than about 10, or even less than about 5. In some embodiments, the spacers 104 include SiN, SiCN, SiOCN, SiOR (wherein R is an alkyl group such as $CH_3$, $C_2H_5$ or $C_3H_7$), SiC, SiOC, SiON, a combination thereof or the like. In some embodiments, the method of forming the spacers 104 includes forming a spacer material layer on the substrate 100, and partially removing the spacer material layer by an anisotropic etching process.

In some embodiments, two strained layers 106 are formed beside each of the dummy gate stacks, and one of the strained layers 106 is between the adjacent dummy gate stacks. In some embodiments, the strained layers 106 include silicon germanium (SiGe) for a P-type FinFET device. In alternative embodiments, the strained layers 106 include silicon carbon (SiC), silicon phosphate (SiP), SiCP or a SiC/SiP multi-layer structure for an N-type FinFET device. In some embodiments, the strained layers 106 may be optionally implanted with a P-type dopant or an N-type dopant as needed. In some embodiments, the method of forming the strained layers 106 includes forming recesses in the fins 102 and growing epitaxy layers from the recesses. Specifically, the strained layers 106 are formed within the recesses and extend upwardly along the sidewalls of the corresponding spacers 104. In some embodiments, the tops of the strained layers 106 are above the surface of the substrate 100. In alternative embodiments, the tops of the strained layers 106 are substantially coplanar with the surface of the substrate 100.

In some embodiments, the first dielectric layer 108 includes nitride such as silicon nitride, oxide such as silicon oxide, phosphosilicate glass (PSG), borosilicate glass (BSG), boron-doped phosphosilicate glass (BPSG), a combination thereof or the like, and is formed by a suitable deposition technique such as spin-coating, chemical vapor deposition (CVD), flowable CVD, plasma-enhanced CVD (PECVD), atomic layer deposition (ALD), a combination thereof or the like. In some embodiments, the top surface of the first dielectric layer 108 is substantially level with the top surfaces of the dummy gate stacks. In some embodiments, a contact etch stop layer (CESL) is formed after the step of forming the strained layers 106 and before the step of forming the first dielectric layer 108, and the CESL includes SiN, SiC or the like.

In some embodiments, the dummy gate stacks are replaced with gate stacks 111. In some embodiments, the dummy gate stacks are removed to form gate trenches in the first dielectric layer 108, and the gate stacks 111 are then formed in the gate trenches. In some embodiments, the method of forming the gate stacks 111 includes forming a stacked layer with CVD, PVD, ALD, plating, or a suitable process, and then performing a CMP process to remove the stacked layer outside of the gate trenches.

In some embodiments, each of the gate stacks 111 includes a gate dielectric layer 110 and a gate 112 (or called "replacement gate") on the gate dielectric layer 110. In some embodiments, the gate stacks 111 extend in a direction different from (e.g., perpendicular to) the extending direction of the fins 102. In some embodiments, each of the gate dielectric layers 110 surrounds the sidewall and bottom of the corresponding gate 112 and on the top and sidewall of the corresponding fin 102, as shown in FIG. 1A. In some embodiments, an interfacial layer such as a silicon oxide layer is formed between the gate dielectric layer 110 and each fin 102.

In some embodiments, each of the gate dielectric layers 110 includes a high-k material having a dielectric constant greater than about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. In alternative embodiments, the gate dielectric layer 110 can optionally include a silicate such as HfSiO, LaSiO, AlSiO, a combination thereof, or a suitable material.

In some embodiments, each of the gates 112 includes a metal material suitable for forming a metal gate or portion thereof. In some embodiments, each of the gates 112 includes a work function metal layer and a fill metal layer on the work function metal layer. The work function metal layer is an N-type work function metal layer or a P-type work function metal layer. In some embodiments, the N-type work function metal layer includes TiAl, TiAlN, or TaCN, conductive metal oxide, and/or a suitable material. In alternative embodiments, the P-type work function metal layer includes TiN, WN, TaN, conductive metal oxide, and/or a suitable material. The fill metal layer includes copper, aluminum, tungsten, or a suitable material. In some embodiments, each of the gates 112 can further include a liner layer, an interface layer, a seed layer, an adhesion layer, a barrier layer, a combination thereof or the like.

Figure 1B:
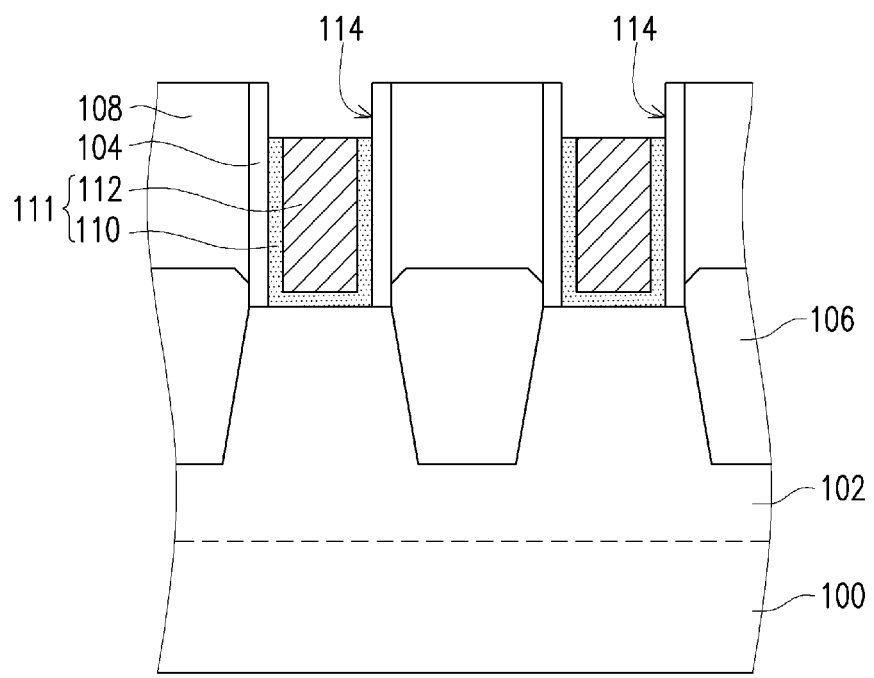

Referring to FIG. 1B, the gate stacks 111 are partially removed such that recesses 114 are respectively provided above the remaining gate stacks 111. In some embodiments, upper portions of the gate stacks 111 are removed to form the recesses 114 that expose the surfaces of the gates 112 and the upper sidewalls of the spacers 104. Specifically, portions of the gates 112 and portions of the gate dielectric layers 110 are removed by an etching back process, and the remaining gates 112 and the remaining gate dielectric layers 110 are exposed by the recesses 114. In some embodiments, one of the recesses 114 is between two adjacent spacers 104 or between portions of the first dielectric layer 108. Upon the partial removal step of FIG. 1B, the top surfaces of the gate stacks 111 are lower than the top surface of the first dielectric layer 108.

Figure 1C:
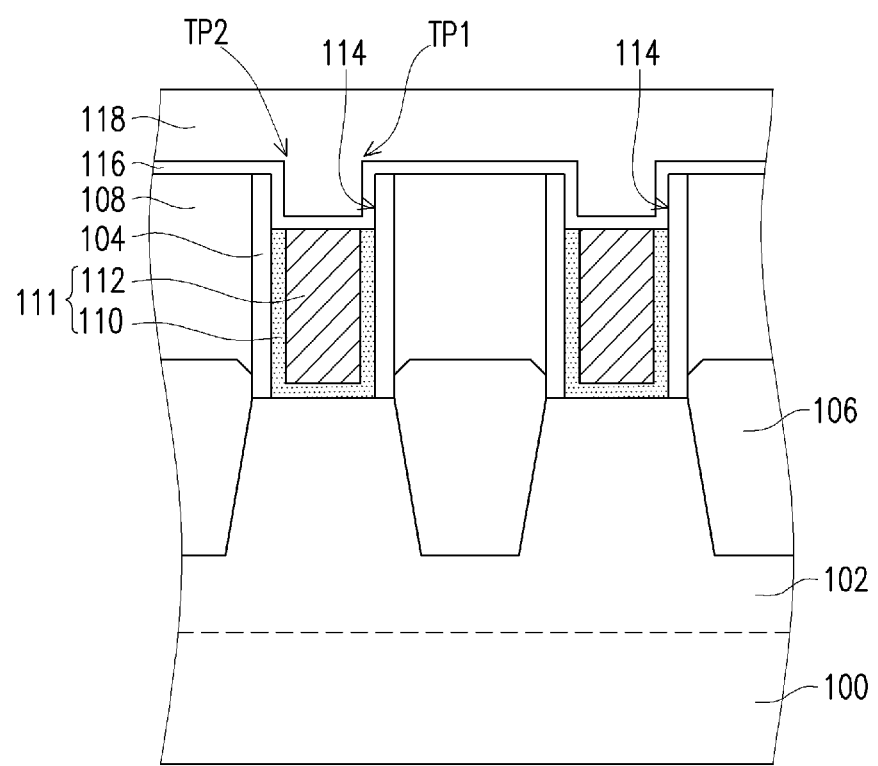

Referring to FIG. 1C, a shielding layer 116 is formed on the surfaces of the recesses 114 and on the top surface of the first dielectric layer 108. In some embodiments, the shielding layer 116 is blanket-formed on the gate stacks 111, the spacers 104 and the first dielectric layer 108. In some embodiments, the shielding layer 116 is in physical contact with the gates 112, the spacers 104 and the first dielectric layer 108. In some embodiments, the shielding layer 116 is in physical contact with the gate dielectric layers 110, as shown in FIG. 1B. In alternative embodiments, the shielding layer 116 is not in physical contact with the gate dielectric layers 110.

Specifically, the shielding layer 116 is conformally formed on the top surfaces of the gates 112, the upper sidewalls and tops of the spacers 104, and the top surface of the first dielectric layer 108, thereby providing multiple turning points around the top corners of the spacers 104. Specifically, two opposite turning points TP1 and TP2 are provided around the top corners of the adjacent spacers 104. In some embodiments, the shielding layer 116 includes SiN, SiC, SiCN, SiON, SiCON, a combination thereof or the like, and is formed by a suitable deposition technique such as CVD, PECVD, atomic ALD, remote plasma ALD (RPALD), plasma-enhanced ALD (PEALD), a combination thereof or the like.

In some embodiments, the thickness of the shielding layer 116 is critical to the following contact hole defining step. The conventional over-etching easily occurs when the shielding layer 116 is too thin. The conventional under-etched film remaining is easily observed when the shielding layer 116 is too thick. In some embodiments, the shielding layer 116 has a thickness of about 3 angstroms to 200 angstroms.

Continue referring to FIG. 1C, a second dielectric layer 118 is formed over the shielding layer 116 and fills in the recesses 114. In some embodiments, the second dielectric layer 118 is blanket-formed on the substrate 100 and fills up the recesses 114. In some embodiments, the second dielectric layer 118 includes a material the same as that of the first dielectric layer 108. In alternative embodiments, the second dielectric layer 118 and the first dielectric layer 108 are made by different materials. In some embodiments, the second dielectric layer 118 includes nitride such as silicon nitride, oxide such as silicon oxide, PSG, BSG, BPSG, a combination thereof or the like, and is formed by a suitable deposition technique such as spin-coating, CVD, flowable CVD, PECVD, ALD, a combination thereof or the like.

Figure 1D:
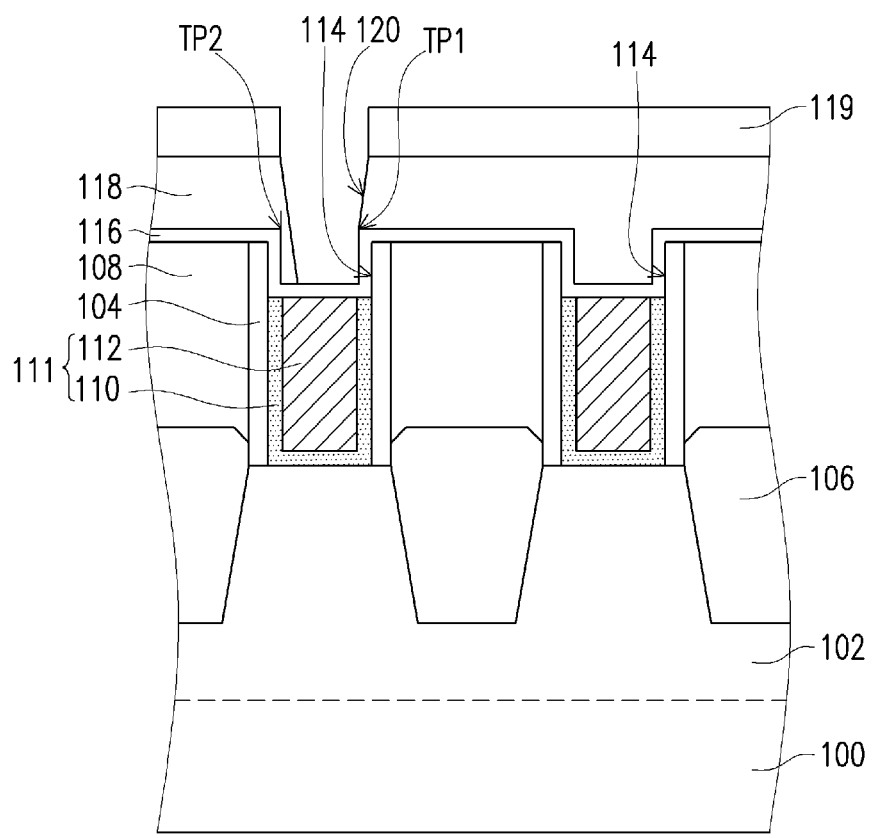

Referring to FIG. 1D, the second dielectric layer 118 is patterned or partially removed to form an opening 120 (or called "contact hole") corresponding to one of the gates 112 of the gate stacks 111. In some embodiments, a mask layer 119 such as a photoresist layer is formed on the second dielectric layer 118, covering the non-target area and exposing the target area such as the intended location of the subsequently formed contact hole. Thereafter, a portion of the second dielectric layer 118 is removed by using the mask layer 119 as an etch mask and using the shielding layer 116 as an etch stop layer. In some embodiments, the opening 120 has an inclined or bent sidewall and exposes a portion of the shielding layer 116. In some embodiments, the opening 120 exposes one turning point TP1 while covers another turning point TP2 of the shielding layer 116.

Figure 1E:
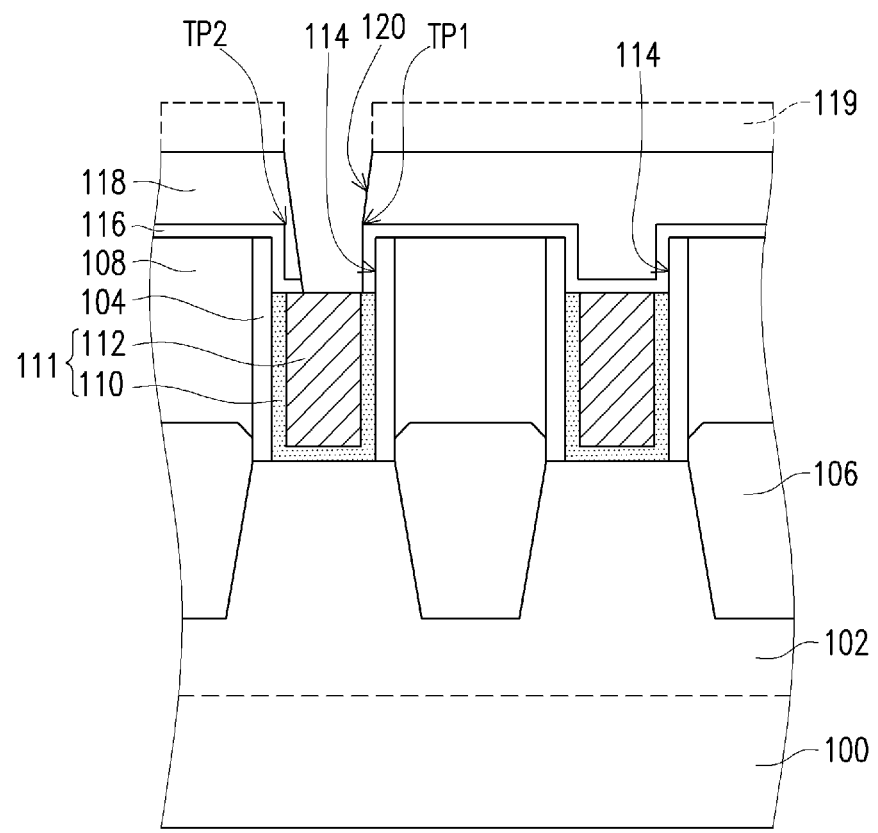

Referring to FIG. 1E, the opening 120 is deepened, until the opening 120 exposes one of the gates 112 of the gate stacks 111. In some embodiments, a portion of the shielding layer 116 is removed by using the mask layer 119 and the second dielectric layer 118 as an etch mask. The mask layer 119 is then removed. In some embodiments, the opening 120 can be formed as a plug, a pillar, a strip, a wall or any suitable shape as needed.

In some embodiments, the opening 120 is defined by multiple etching steps (e.g., steps shown in FIG. 1D and FIG. 1E) rather than a single etching step. Such multi-step etching is beneficial to provide a better etching profile. Specifically, the shielding layer 116 effectively protects the adjacent spacers and dielectric materials from being damaged when the undesired over-etching and/or misalignment occurs. Besides, the etching profile can be easily controlled by providing the second dielectric layer 118 and the underlying shielding layer 116 with different etching rates.

Figure 1F:
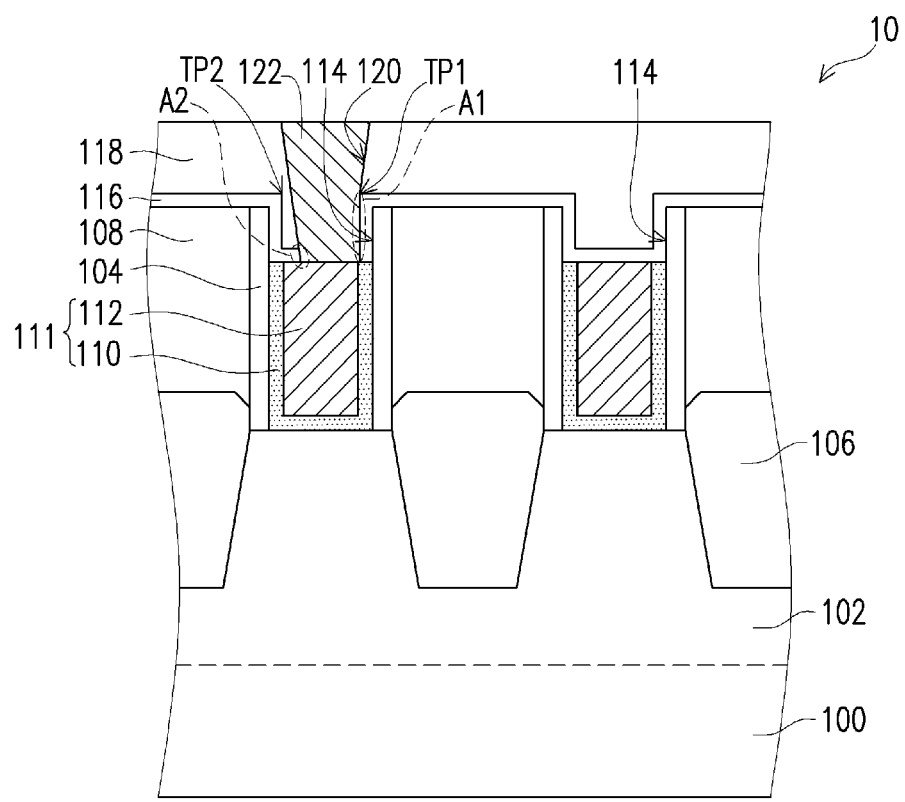

Referring to FIG. 1F, a connector 122 is formed in the opening 120. In some embodiments, the connector 122 is intended to represent any type of conductive materials and structures and is electrically connected to the corresponding gate 112. In some embodiments, the connector 122 includes metal, such as W, Cu, an alloy thereof or any metal material with suitable resistance and gap-fill capability. In some embodiments, a metal layer is formed on the substrate 100 filling in the opening 120. The metal layer is formed by sputtering, CVD, electrochemical plating (ECP), a combination thereof or the like. A planarization step such as CMP is then performed to remove a portion of the metal layer until the top of the second dielectric layer 118 is exposed. In some embodiments, the top surface of the connector 122 is substantially coplanar with the top surface of the second dielectric layer 118. A FinFET device 10 of the disclosure is thus completed.

Besides, as the dimension of the device is scaled down, the process window for the contact hole defining step is rather small. The conventional cap layers are provided merely on the gates, so the adjacent spacers and dielectric materials may be damaged during the contact hole defining step when over-etching and/or misalignment occurs. Therefore, the profile of the opening or contact hole is deformed and the reliability/leakage window of the device is narrowed. However, such issues are not observed in the disclosure. Specifically, the shielding layer 116 of the disclosure provides an improved protection effect since it is formed not only on the gates 112 but also on the adjacent spacers 104 and the first dielectric layer 108. In such manner, the first etching step (e.g., the step of FIG. 1D) of defining the opening 120 stops on the surface of the shielding layer 116 without damaging the adjacent spacers and the dielectric materials. Besides, the shielding layer 116 and the second dielectric layer 118 have different etching rates, so the second etching step (e.g., the step of FIG. 1E) of defining the opening 120 stops on the surface of the gate 112 without over-etching or damaging the gate 112.

Figure 2:
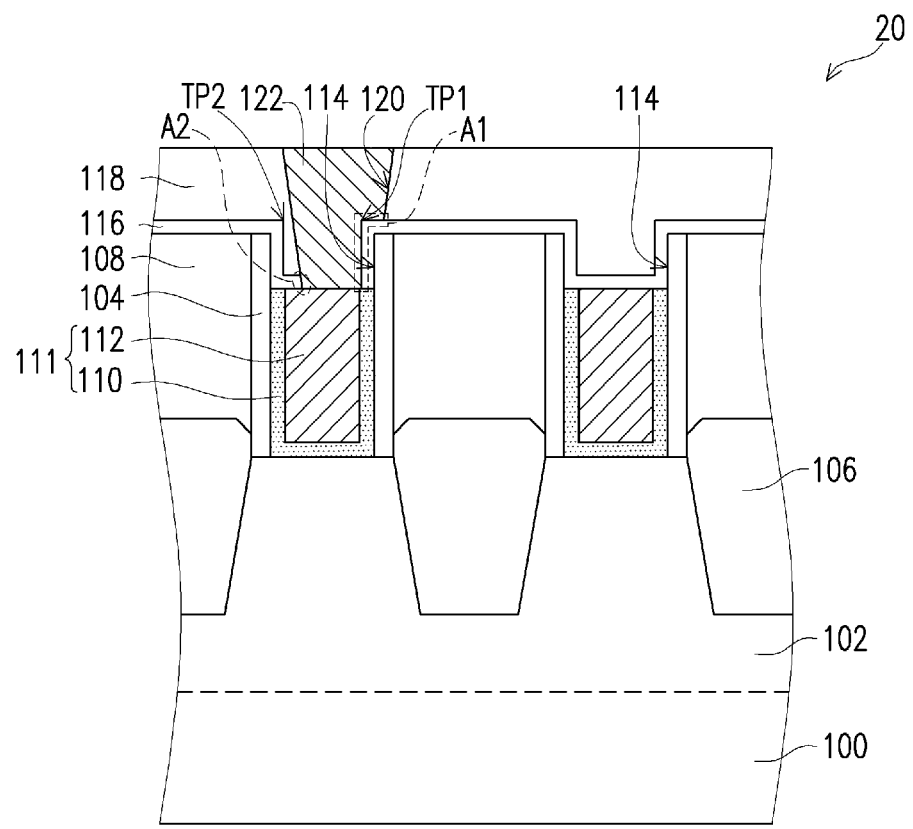
FIG. 2 is a schematic cross-sectional view of a FinFET device in accordance with some embodiments.

In some embodiments, when over-etching and/or misalignment occurs, the location of the opening 120 is shifted and/or the shape of the opening 120 is deformed, and thus, the opening 120 is formed with a stepped sidewall and further exposes a top surface of the shielding layer 116, as shown in FIG. 2. In the disclosure, the shielding layer 116 and the second dielectric layer 118 are disposed in such manner that the lateral etching/damage to the adjacent spacers and dielectric materials and/or the vertical etching/damage to the upper portion of the gate are not observed during the contact hole defining step, and thus, the contact profile and the device performance are significantly improved.

Figure 3:
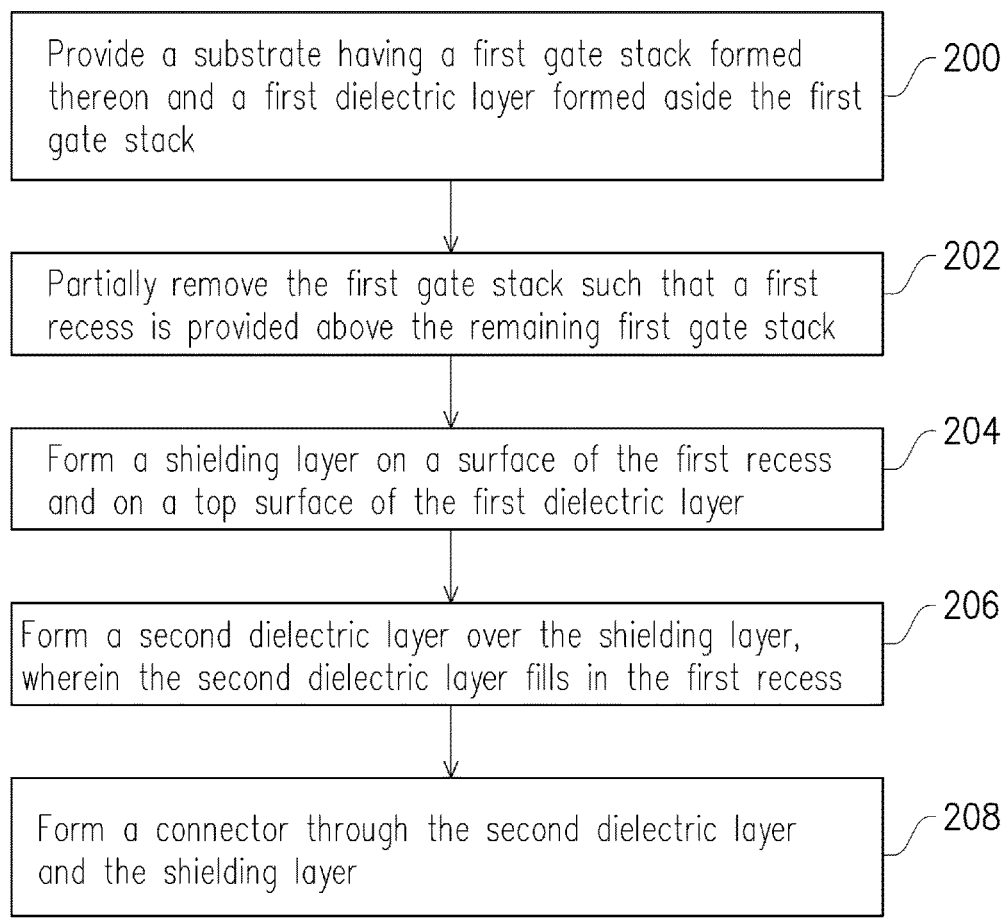
FIG. 3 is a flow chart of a method of forming a FinFET device in accordance with some embodiments.

The said process steps of FIG. 1A to FIG. 1F can be concisely illustrated with reference to the flow chart of FIG. 3.

At step 200, a substrate 100 is provided a first gate stack (e.g., the left gate stack 111) formed thereon and a first dielectric layer 108 formed aside the first gate stack, as shown in FIG. 1A. In some embodiments, the substrate 100 further has a second gate stack (e.g., the right gate stack 111) formed thereon, and the first dielectric layer 108 is aside the second gate stack. Specifically, the first dielectric layer 108 surrounds the sidewalls and exposes the top surfaces of the first and second gate stacks (e.g., the left and right gate stacks 111). In some embodiments, one spacer 104 is formed between the first dielectric layer 108 and each of the first and second gate stacks.

At step 202, the first gate stack (e.g., the left gate stack 111) is partially removed such that a first recess (e.g., the left recess 114) is provided above the remaining first gate stack, as shown in FIG. 1B. In some embodiments, the second gate stack (e.g., the right gate stack 111) is partially removed during the step of partially removing the first gate stack, such that a second recess (e.g., the right recess 114) is provided above the second gate stack.

At step 204, a shielding layer 116 is formed on the surface of the first recess (e.g., the left recess 114) and on the top surface of the first dielectric layer 108, as shown in FIG. 1C. In some embodiments, the shielding layer 116 is further formed on the entire surface of the second recess (e.g., the right recess 114) and on tops of the spacers 104.

At step 206, a second dielectric layer 118 is formed over the shielding layer 116 and fills in the first recess (e.g., the left recess 114), as shown in FIG. 1C. In some embodiments, the second dielectric layer 118 further fills in the second recess (e.g., the right recess 114).

At step 208, a connector 122 is formed through the second dielectric layer 118 and the shielding layer 116, as shown in FIG. 1D to FIG. 1F. In some embodiments, the second dielectric layer 118 is partially removed to form an opening 120 therein, as shown in FIG. 1D. Thereafter, the opening 120 is deepened until the top surface of the first gate (e.g., the left gate 112) of the first gate stack (e.g., the left gate stack 111) is exposed, as shown in FIG. 1E. Afterwards, the connector 122 is filled in the opening 120, as shown in FIG. 1F. In some embodiments, no connector is in physical contact with the second gate stack (e.g., the right gate stack 111) aside the first gate stack. The FinFET device of the disclosure is thus completed with the described process steps. However, it is not limited to add one or more additional steps among the above steps for fabricating the FinFET device.

In the above-mentioned embodiments, a "gate last" process is implemented to form a FinFET device. However, another process such as a "gate first" process can be applied by using similar processes as described herein. The methods disclosed herein can be easily integrated with a CMOS process flow and do not require additional complicated steps to achieve the desired results. It is understood that embodiments disclosed herein offer different advantages, and that no particular advantage is necessarily required for all embodiments.

The structures of the FinFET devices of the disclosure are described with reference to FIG. 1F and FIG. 2.

In some embodiments, a FinFET device 10/20 includes a substrate 100, a first gate stack (e.g., the left gate stack 111), a first dielectric layer 108, a shielding layer 116, a second dielectric layer 118 and a connector 122. The substrate 100 has at least one fin 102. The first gate stack is across the at least one fin 102. The first dielectric layer 108 is aside the first gate stack. In some embodiments, the top surface of the first gate stack is lower than the top surface of the first dielectric layer 108 such that a first recess (e.g., the left recess 114) is provided above the first gate stack. The second dielectric layer 118 is over the first dielectric layer 108 and fills in the first recess. The connector 122 is through the second dielectric layer 118 and electrically connected to the first gate stack. The shielding layer 116 is between the first dielectric layer 108 and the second dielectric layer 118 and in physical contact with the connector 122.

In some embodiments, the contact area A1 between the shielding layer 116 and one side of the connector 122 is greater than the contact area A2 between the shielding layer 116 and another side of the connector 122, as shown in FIG. 1F and FIG. 2. From another point of view, in a certain cross-section, the shielding layer 116 is in "surface contact" with one side of the connector 122 while in "point contact" with another side of the connector 122. However, the present disclosure is not limited thereto. In alternative embodiments, the contact area A1 between the shielding layer 116 and one side of the connector 122 can be substantially the same as the contact area A2 between the shielding layer 116 and another side of the connector 122.

In some embodiment, the connector 122 is in physical contact with one turning point TP1 of the shielding layer 116 but not in physical contact with another turning point TP2 of the shielding layer 116, as shown in FIG. 1F and FIG. 2. However, the present disclosure is not limited thereto. In alternative embodiments, the connector 122 is in physical contact with opposite turning points TP1 and TP2 of the shielding layer 116. In yet alternative embodiments, the connector 122 is not in physical contact with opposite turning points TP1 and TP2 of the shielding layer 116.

In some embodiments, the FinFET device 10/20 further includes a second gate stack (e.g., the right gate stack 111) across the at least one fin 102. The top surface of the second gate stack is lower than the top surface of the first dielectric layer 108 such that a second recess (e.g., the right recess 114) is provided above the second gate stack. In some embodiments, the shielding layer 116 further extends to cover the surface of the second recess.

In some embodiments, the FinFET device 10/20 further includes spacers 104 on sidewalls of the first and second gate stacks (e.g., the left and right gate stacks 111). In some embodiments, the shielding layer 116 further extends to cover tops of the spacers 104. The spacers 104 include a nitrogen-containing dielectric material, a carbon-containing dielectric material or both, and the spacers 104 have a dielectric constant less than about 10.

In the above embodiments, the method of the disclosure is applied to a FinFET device process, but the disclosure in not limited thereto. In alternative embodiments, the method of disclosure can be applied to a planar device process.

Figure 4:
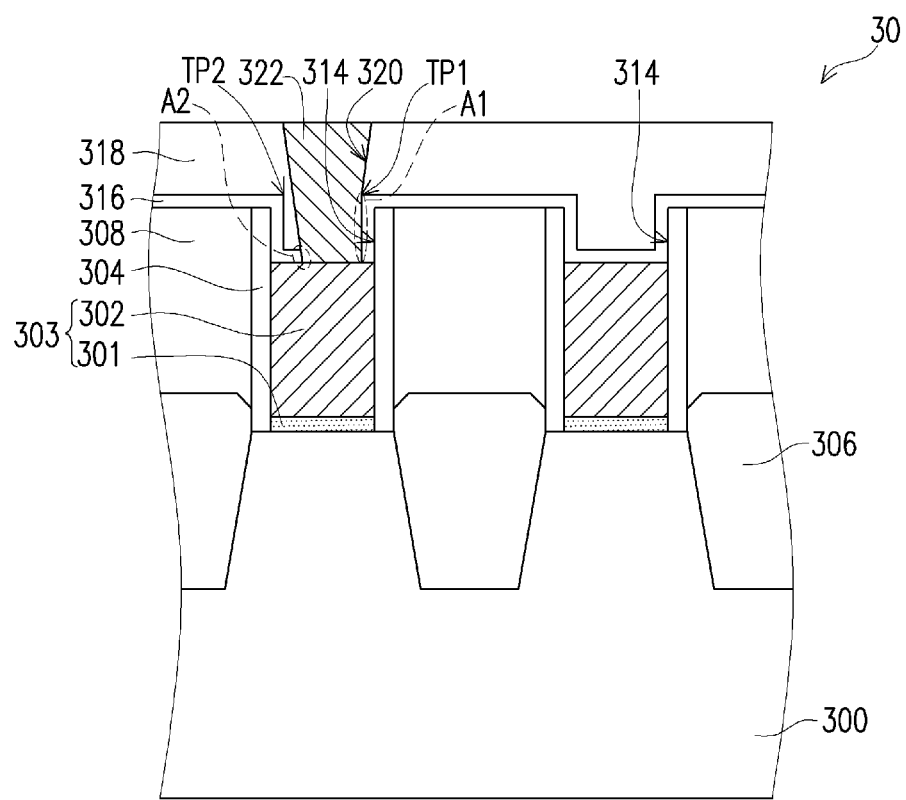
FIG. 4 to FIG. 5 are schematic cross-sectional views of semiconductor devices in accordance with alternative embodiments.
Figure 5:
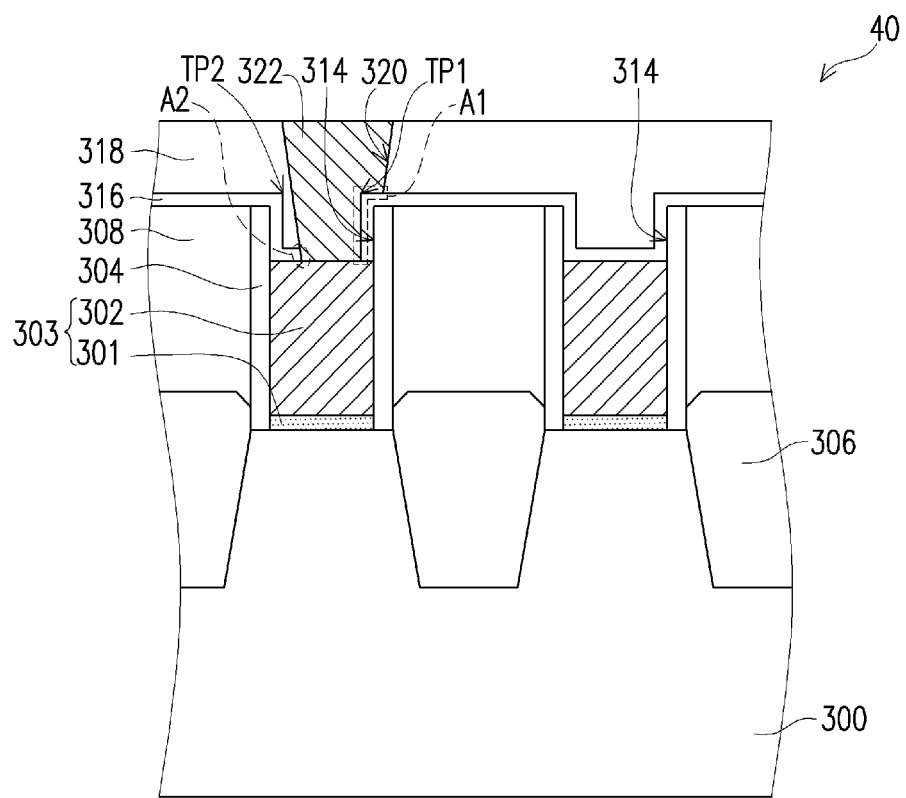

FIG. 4 to FIG. 5 are cross-sectional views of semiconductor devices in accordance with alternative embodiments.

As shown in FIG. 4 to FIG. 5, a semiconductor device 30/40 includes a planar substrate 300, gate stacks 303, spacers 304, strained layers 306, a first dielectric layer 308, a shielding layer 316, a second dielectric layer 318 and a connector 322.

The gate stacks 303 are over planar substrate 300. In some embodiments, each of the gate stacks 303 includes a gate dielectric layer 301 on the planar substrate 300 and a gate 302 on the gate dielectric layer 301. In some embodiments, each of the gate dielectric layers 301 includes silicon oxide, a high-k material or a combination thereof, and each of the gates 302 includes a silicon-containing material, a metal-containing material or a combination thereof. The spacers 304 are formed on sidewalls of the gate stacks 303. The spacers 304 include a nitrogen-containing dielectric material, a carbon-containing dielectric material or both, and the spacers have a dielectric constant less than about 10. Two strained layers 306 are formed in the planar substrate 300 beside each of the gate stacks 303, and one of the strained layers 306 is between the adjacent gate stacks 303.

The first dielectric layer 308 is aside or around the gate stacks 303. In some embodiments, the top surfaces of the gate stacks 303 are lower than the top surface of the first dielectric layer 308 such that recesses 314 are provided above the gate stacks 303. The shielding layer 316 is on the surfaces of the recesses 314 and extends onto the top surface of the first dielectric layer 308 and top surfaces of the spacers 304. The shielding layer 316 includes SiN, SiC, SiCN, SiON, SiCON or a combination thereof.

The second dielectric layer 318 is over the shielding layer 316 and fills in the recesses 314. In some embodiments, an opening 320 is through the second dielectric layer 318 and the shielding layer 316 and exposes one of the gates 302 of the gate stacks 303. The connector 322 is located in the opening 320 and is electrically connected to the gate 302 of the corresponding gate stack 303.

In some embodiments, the contact area A1 between the shielding layer 316 and one side of the connector 322 is greater than the contact area A2 between the shielding layer 316 and another side of the connector 322, as shown in FIG. 4 and FIG. 5. In some embodiment, the connector 322 is in physical contact with one turning point TP1 of the shielding layer 316 but not in physical contact with another turning point TP2 of the shielding layer 316, as shown in FIG. 4 and FIG. 5.

The above embodiments in which each of the gate dielectric layers, the gates, the spacers, the strained layers, the first and dielectric layers and the shielding layer is a single layer are provided for illustration purposes, and are not construed as limiting the present disclosure. In some embodiments, at least one of these described elements can be a multi-layer structure as needed.

In view of the above, in some embodiments, the shielding layer and the overlying dielectric layer are provided with different etching rates, and combine to control the etching profile during the opening forming step. Specifically, the shielding layer of the disclosure is formed not only on the gates but also on the adjacent spacers and the dielectric layer, so as to provide an improved protection effect for the adjacent elements. By such disposition, the multi-step etching can first stop on the surface of the shielding layer and then stops on the surface of the gate without damaging the adjacent elements. An opening (such as a contact hole) and therefore a connector (such as a contact) can be provided with improved etching profiles and properties. Accordingly, the WAT (wafer acceptance test) failure is decreased, the product yield is enhanced, and the reliability/leakage window is widened.

In accordance with some embodiments of the present disclosure, a semiconductor device includes a substrate, a first gate stack, a spacer, a first dielectric layer, a shielding layer and a connector. The first gate stack is over the substrate. The spacer is disposed on and contacted to at least one sidewall of the first gate stack. The first dielectric layer is aside the spacer. The shielding layer covers a top surface of the spacer and a top surface of the first dielectric layer. The connector contacts a portion of a top surface of the first gate stack.

In accordance with alternative embodiments of the present disclosure, a FinFET device includes a substrate, a first gate stack, a first dielectric layer, a second dielectric layer, a connector and a shielding layer. The substrate has at least one fin. The first gate stack is across the at least one fin. The first dielectric layer is aside the first gate stack. The second dielectric layer is over the first dielectric layer. The connector is through the second dielectric layer and electrically connected to the first gate stack. The shielding layer is between the first dielectric layer and the second dielectric layer, and between the connector and the first dielectric layer, and in physical contact with the connector.

In accordance with some embodiments of the present disclosure, a method of forming a semiconductor device includes the following steps. A substrate having a first gate stack formed thereon and a first dielectric layer formed aside the first gate stack is provided. A shielding layer is formed on a top surface of the first gate stack and on a top surface of the first dielectric layer. A second dielectric layer is formed over the shielding layer. A connector is formed through the second dielectric layer and the shielding layer and electrically connected to the first gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a first gate stack over a substrate;
a spacer, disposed on and contacted to at least one sidewall of the first gate stack;
a first dielectric layer aside the spacer;
a shielding layer covering a top surface and a portion of a sidewall of the spacer and a top surface of the first dielectric layer; and
a connector contacting a first portion of a top surface of the first gate stack.

2. The semiconductor device of claim 1, wherein the shielding layer further extends to cover a second portion of the top surface of the first gate stack.

3. The semiconductor device of claim 2, further comprising a second dielectric layer over the shielding layer, wherein the connector is through the second dielectric layer and the shielding layer.

4. The semiconductor device of claim 3, wherein a portion of the second dielectric layer is located between the shielding layer and the connector.

5. The semiconductor device of claim 1, wherein the shielding layer comprises two turning points opposite to each other, and the two turning points are around top corners of the spacers.

6. The semiconductor device of claim 5, wherein at least one of the two turning points is covered by the second dielectric layer.

7. The semiconductor device of claim 5, wherein the two turning points are in contact with the connector.

8. The semiconductor device of claim 1, wherein the first gate stack comprises a gate dielectric layer and a gate.

9. The semiconductor device of claim 8, wherein a portion of the gate dielectric layer is disposed between the first dielectric layer and the gate, and the shielding layer is in contact with the gate dielectric layer.

10. The semiconductor device of claim 8, wherein the gate dielectric layer is disposed between the gate and the substrate, and the shielding layer is not in contact with the gate dielectric layer.

11. The semiconductor device of claim 1, further comprising a second gate stack over the substrate, wherein the shielding layer further extends to cover a top surface of the second gate stack.

12. The semiconductor device of claim 1, wherein the semiconductor device is a FinFET device or a planar device.

13. A FinFET device, comprising:
a substrate having at least one fin;
a first gate stack across the at least one fin;
a first dielectric layer aside the first gate stack;
a second dielectric layer over the first dielectric layer, wherein a bottom surface of a portion of the second dielectric layer is lower than a top surface of the first dielectric layer;
a connector through the second dielectric layer and electrically connected to the first gate stack; and
a shielding layer between the first dielectric layer and the second dielectric layer, and between the connector and the first dielectric layer, and in physical contact with the connector.

14. The FinFET device of claim 13, further comprising spacers on sidewalls of the first gate stack, wherein portions of the spacers are located between the shielding layer and the first dielectric layer, and the shielding layer further extends to cover tops of the spacers.

15. The FinFET of claim 13, wherein the connector covers a portion of a top surface of the shielding layer.

16. The FinFET device of claim 13, further comprising a second gate stack across the at least one fin, and the shielding layer further extends to cover a surface of the second gate stack.

\* \* \* \* \*